(12) United States Patent
Yajima et al.

(10) Patent No.: US 8,680,636 B2
(45) Date of Patent: Mar. 25, 2014

(54) PACKAGE-TYPE SOLID-STATE IMAGING APPARATUS WITH EXHAUSTING MEANS

(75) Inventors: Atsushi Yajima, Aichi (JP); Tokiko Katayama, Aichi (JP)

(73) Assignee: Sony Corporation, Tokyo (JP)

(*) Notice: Subject to any disclaimer, the term of this patent is extended or adjusted under 35 U.S.C. 154(b) by 484 days.

(21) Appl. No.: 12/051,331

(22) Filed: Mar. 19, 2008

(65) Prior Publication Data

US 2008/0237768 A1 Oct. 2, 2008

(30) Foreign Application Priority Data

Mar. 29, 2007 (JP) ................. 2007-089256

(51) Int. Cl.
*H01L 31/0203* (2006.01)

(52) U.S. Cl.
USPC ........... 257/434; 257/431; 257/432; 257/433; 257/E31.001; 257/667; 348/340

(58) Field of Classification Search
USPC .......... 257/431, 432, 433, 434, E31.001, 667, 257/783; 348/340
See application file for complete search history.

(56) References Cited

U.S. PATENT DOCUMENTS

| | | | | |
|---|---|---|---|---|
| 5,721,450 A | * | 2/1998 | Miles | ............................. 257/667 |
| 7,235,887 B2 | * | 6/2007 | Lee et al. | ...................... 257/783 |
| 7,274,096 B2 | * | 9/2007 | Shiraishi | ....................... 257/681 |
| 7,659,936 B2 | * | 2/2010 | Cho et al. | ...................... 348/340 |
| 7,781,852 B1 | * | 8/2010 | Faheem et al. | ................ 257/419 |
| 2001/0010562 A1 | * | 8/2001 | Nakagishi et al. | ............ 348/374 |
| 2005/0001219 A1 | * | 1/2005 | Minamio et al. | ................ 257/79 |
| 2005/0247992 A1 | * | 11/2005 | Tsukamoto et al. | .......... 257/433 |

FOREIGN PATENT DOCUMENTS

| | | |
|---|---|---|
| JP | 11-074495 | 3/1999 |
| JP | 2001-281050 | 10/2001 |
| JP | 2002-124589 | 4/2002 |
| JP | 07-037256 | 2/2003 |
| JP | 2003-037756 | 2/2003 |
| JP | 2005-026426 | 1/2005 |
| JP | 2005-278034 | 10/2005 |
| JP | 2006-165964 | 6/2006 |

OTHER PUBLICATIONS

Japanese Office Action issued on Jun. 5, 2012, in connection with counterpart JP Application No. 2002-124589.

* cited by examiner

*Primary Examiner* — Kimberly Rizkallah
*Assistant Examiner* — Caleb Henry
(74) *Attorney, Agent, or Firm* — Dentons US LLP

(57) ABSTRACT

A solid-state imaging apparatus is provided. A solid-state imaging device chip is enclosed in a package having an optically transparent member. An adhesive layer is formed on an internal surface of the package, and a penetration hole is formed in a bottom part of the package to communicate with an open space in the package.

13 Claims, 15 Drawing Sheets

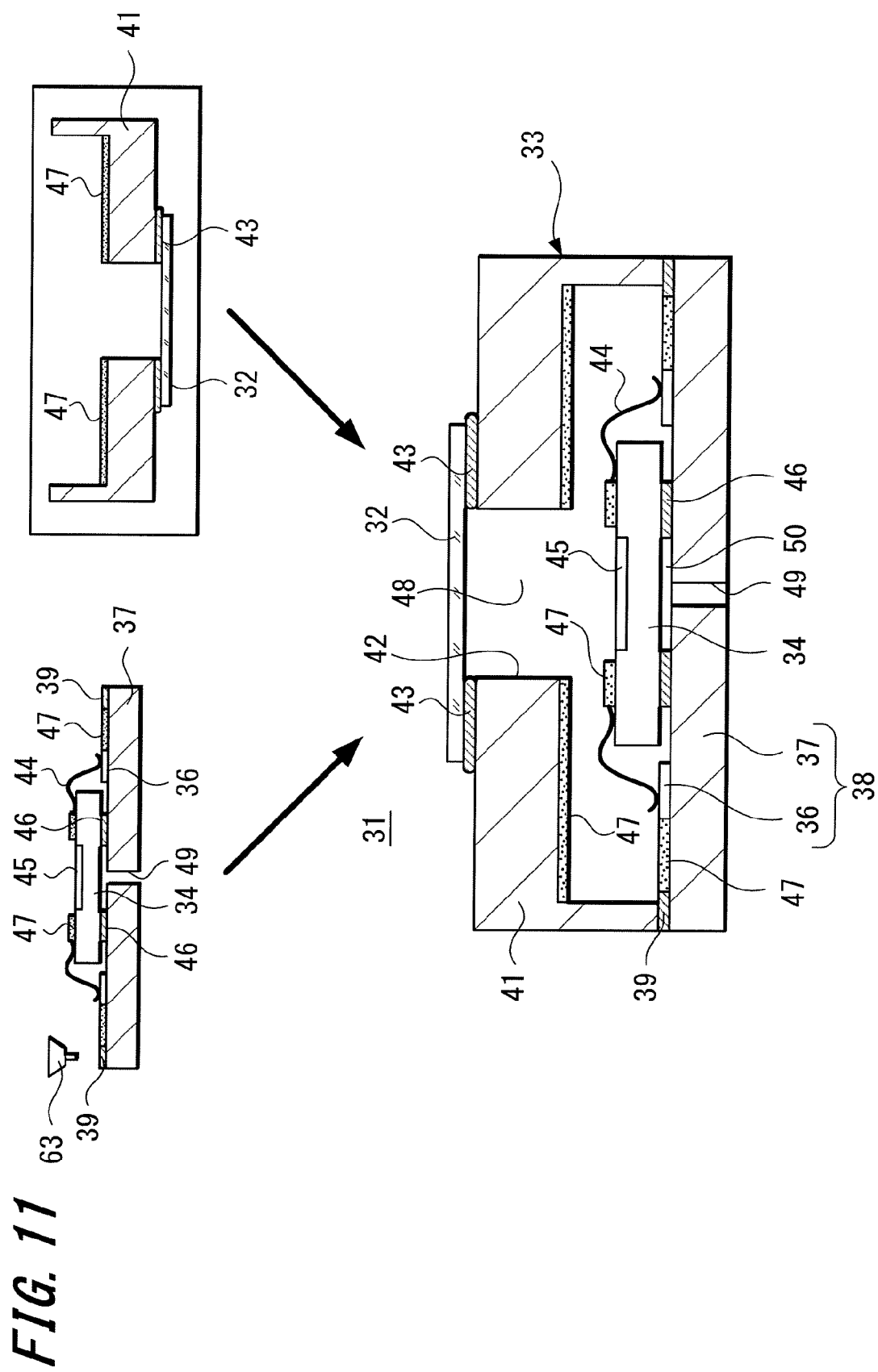

PACKAGE-TYPE SOLID-STATE IMAGING APPARATUS WITH EXHAUSTING MEANS

CROSS REFERENCES TO RELATED APPLICATIONS

The invention contains subject matter related to Japanese Patent Application JP 2007-089256 filed in the Japanese Patent Office on Mar. 29, 2007, the entire contents of which being incorporated herein by reference.

BACKGROUND OF THE INVENTION

1. Field of the Invention

The invention relates to a solid-state imaging apparatus, in particular to a package-type solid-state imaging apparatus enclosing a solid-state imaging device chip in a package.

2. Description of the Related Art

Recently, as a solid-state imaging apparatus to be mounted in an electronic device module such as a camera module used in a video camera, a digital camera, a mobile-phone with a camera, etc., a package-type solid-state imaging apparatus is widely adopted.

FIG. 1 illustrates an example of a package-type solid-state imaging apparatus of related art. A package-type solid-state imaging apparatus 1 encloses in a package 4 a solid-state imaging device chip 3 having a light reception part 2. An opening part opposing the light reception part 2 of the package 4 is closed with an optically transparent member 5. The package 4 is made of plastic, ceramic, glass, etc., and the solid-state imaging device chip 3 is arranged in an internal open space in the package 4. An external connection terminal 6 is led out from the package 4, and an inner lead 7 of the external connection terminal 6 and an electrode pad (not shown) of the solid-state imaging device chip 3 are bonded by a metal wire 8 to be electrically connected with each other. An adhesive layer 9 is formed on the surface of an internal wall of the package 4 so that a minute foreign substance floating in the internal open space of the package 4 adheres to the adhesive layer 9. The adhesive layer 9 prevents the minute foreign substance in the open space of the package 4, such as floating dust, etc., from adhering to the light reception part 3 of the solid-state imaging device chip 3 to exert a bad influence to image display (see, for example, Japanese Unexamined Patent Application Publication No. 2003-37256). If a foreign substance such as dust, etc. adheres to the imaging surface of the solid-state imaging device chip 3, when an image imaged with the solid-state imaging apparatus 1 is displayed, the foreign substance appears as a black spot or smear, so that the solid-state imaging apparatus 1 becomes an inferior product.

FIG. 2 illustrates another example of a package-type solid-state imaging apparatus of related art, which is configured as a so-called imaging module. An imaging module 11 includes a substrate 12, on the surface of which wirings (not shown) are formed, and a solid-state imaging device chip 13 mounted on the substrate 12 together with a chip part 14 such as a capacitor, a resistor, etc. A holder 15 supporting a light reception lens 16 and an infrared cut filter 17 is joined to the substrate 12 such that the solid-state imaging device chip 13 and the chip part 14 are closely sealed. The holder 15 includes a casing part 15a and a cylindrical part 15b, and an attachment 18 supporting the light reception lens 16 is engaged with the cylindrical part 15b. The solid-state imaging device chip 13 is electrically connected with a wiring connection electrode part 19 on the substrate 12 by a metal wire (so-called bonding wire) 21.

A resin 23 is formed on an upper wall surface of the casing part 15a through a stream stopping frame 22, and a resin 25 is formed through a stream stopping frame 24 such that the chip part 14 on the substrate 12 is buried. The resin 23 and the resin 25 have the adherence property. In this imaging module 11, even if dust adheres to the internal surface of the casing part 15a, peeling off of the dust is prevented by the resin 23 and the resin 25, and thereby occurrence of failure due to dust is avoided (see Japanese Unexamined Patent Application Publication No. 2006-165964).

Such package-type solid imaging apparatuses configured to prevent occurrence of failure by causing a minute foreign substance such as dust, etc. to adhere to the adhesive layer are also described in Japanese Unexamined Patent Application Publications No. 11-74495 and No. 2005-278034.

SUMMARY OF THE INVENTION

In the above-described package-type solid imaging apparatuses configured to prevent occurrence of failure by forming an adhesive layer in a package to cause a minute foreign substance such as dust, etc. in the package to adhere to the adhesive layer, however, failure, in particular failure in a circuit wiring part including an inner lead, still occurs, and practical application has been difficult. Specifically, if the apparatuses are left while being turned on in a high temperature and high humidity environment, the circuit wiring part erodes to cause failure. In the case of a package made of ceramic, plastic, glass, etc., an inner lead, the surface of which is made of gold (Au), is used, and in the case of a package including a so-called rigid substrate, which is a solid-state imaging device chip substrate, a circuit wiring based on a laminated film of Cu, Ni, and Au laminated in this order from the bottom is used. For the electrode pad of a solid-state imaging device chip, generally Al is used. Erosion occurs in such an Al electrode pad and an Au circuit wiring in the high temperature and high humidity condition.

The inventors of the invention have examined the causes of the erosion and found that due to a change in the environment such as a change to a high temperature and high humidity condition, gas and ion are generated from the adhesive layer formed in the package, and the generated gas and ion have an influence on occurrence of the erosion. In particular, it has been found out that although Au is intrinsically highly corrosive-resistant, in the Au circuit wiring, because an Au thin film is formed by a porous film, a metal on the ground, for example, an Ni film, is eroded through multi-holes of the porous film, and further, a Cu film under the Ni film is eroded.

The invention addresses the above-described and other problems, and based on the above-described examination, provides a package-type solid-state imaging apparatus reliable enough for practical use and superior in durability.

According to an embodiment of the invention, there is provided a solid-state imaging apparatus, in which a solid-state imaging device chip is enclosed in a package having an optically transparent member. An adhesive layer is formed on an internal surface of the package, and a penetration hole is formed in a bottom part of the package to communicate with an open space in the package.

In the solid-state imaging apparatus, a minute foreign substance such as dust, etc. entered into the package or generated in the package adheres to the adhesive layer when the foreign substance is moved due to vibration, shock, etc. Because the penetration hole communicating with the open space in the package is formed in the bottom part of the package, gas, ion, etc., generated from the adhesive layer due to an environmental change such as a change to a high temperature and high humidity condition, are discharged through the penetration hole.

According to the solid-state imaging apparatus, because the minute foreign substance such as dust, etc. in the package is caused to adhere to the adhesive layer formed on the internal surface of the package when the foreign substance is moved by vibration, shock, etc., the probability that the foreign substance adheres to the imaging surface of the solid-state imaging device chip is greatly reduced. The gas, ion, etc. generated from the adhesive layer are discharged through the penetration hole, so that occurrence of erosion of the circuit wiring part can be prevented. Accordingly, the reliability and the durability of the solid-state imaging apparatus can be enhanced.

BRIEF DESCRIPTION OF THE DRAWINGS

FIG. 11 is a production process diagram illustrating a third part of the example of the production method of the package-type solid-state imaging apparatus.

DESCRIPTION OF THE PREFERRED EMBODIMENTS

Examples of embodiments of the invention will be described below with reference to drawings.

Figure 3:
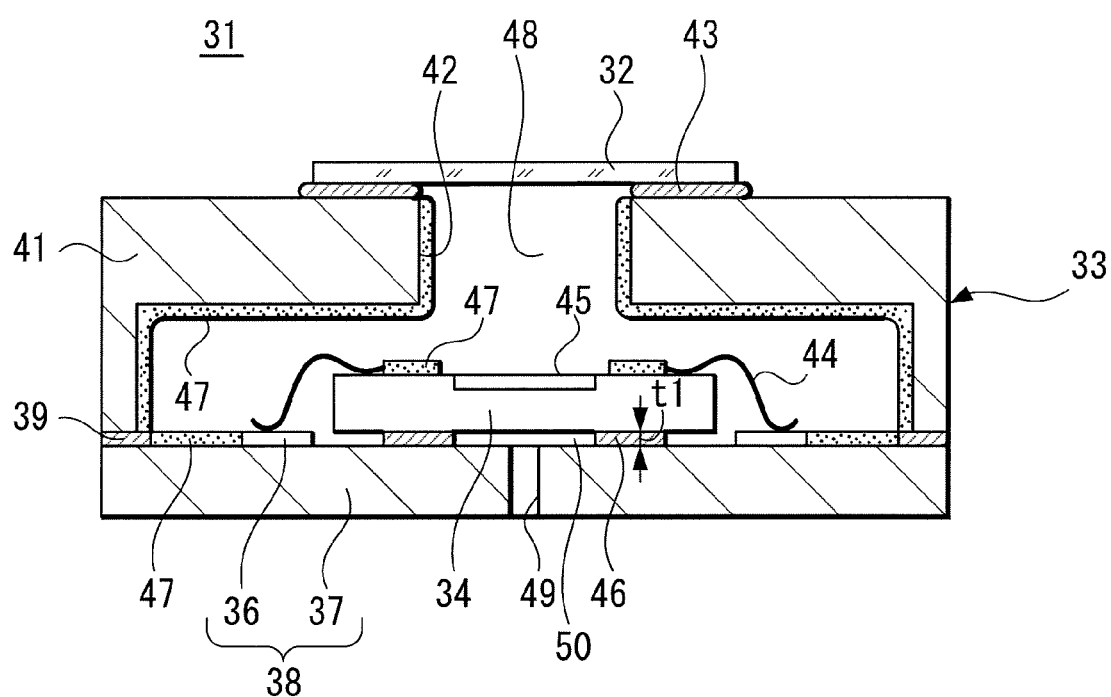
FIG. 3 is a schematic configuration diagram of an example of a package-type solid-state imaging apparatus according to an embodiment of the invention.
Figure 4A:
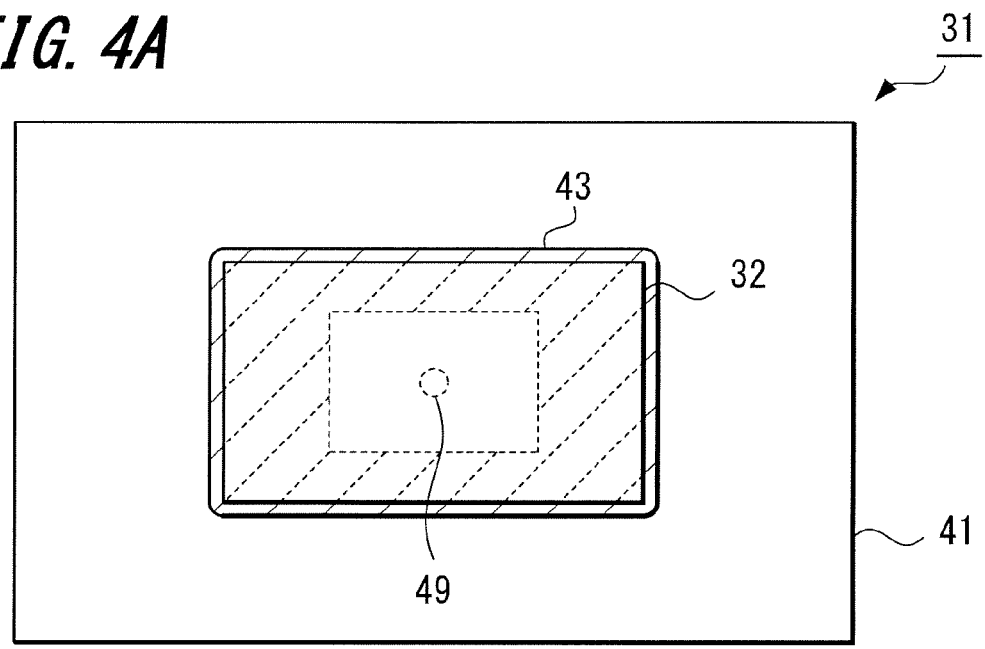
FIG. 4A is a top view of the package-type solid-state imaging apparatus of FIG. 3.
Figure 4B:
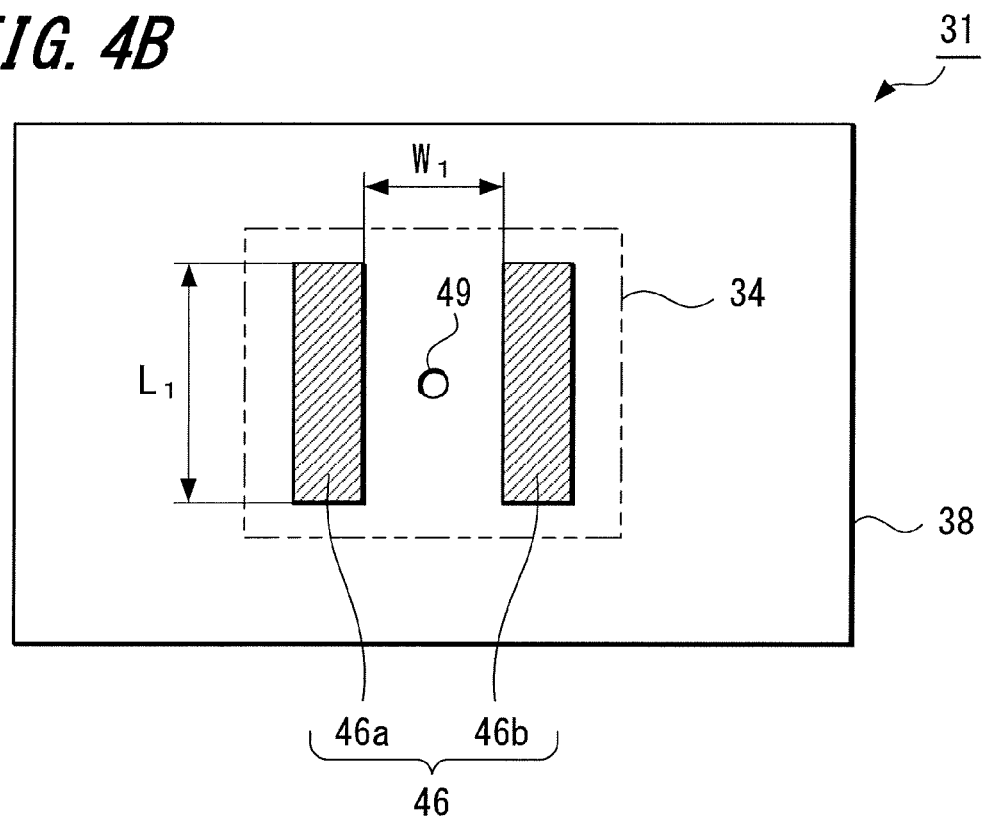
FIG. 4B is a plain view illustrating a shape of a bond layer bonding a solid-state imaging device chip and a substrate module of the package-type solid-state imaging apparatus of FIG. 3.

FIG. 3, FIG. 4A, and FIG. 4B illustrate an example of a package-type solid-state imaging apparatus according to an embodiment of the invention.

A solid-state imaging apparatus 31 according to this embodiment includes a package 33 having an optically transparent member 32, and a solid-state imaging device chip 34 such as a CCD image sensor or a CMOS image sensor enclosed in the package 33. The package 33 includes a substrate module 38, in which a circuit wiring 36 of a predetermined pattern is formed on the surface of an insulating substrate 37, and a cover body 41 connected with the substrate module 38 and protecting the solid-state imaging device chip 34. The optically transparent member 32 is connected with the cover body 41 such that an opening 42, through which an incident light enters, is closed. The substrate module 38 and the cover body 41 are hermetically connected through a bond layer 39 at their peripheral portions. The cover body 41 and the optically transparent member 32 are hermetically connected through a bond layer 43.

The solid-state imaging device chip 34 includes a semiconductor chip in which an imaging region 45 and a peripheral circuit and a peripheral electrode pad (not shown) are formed, and the rear side of the semiconductor chip is bonded to the substrate module 38 through a bond layer 46. The solid-state imaging device chip 34 is mounted on the substrate module 38 with the electrode pad electrically connected with the circuit wiring 36 of the substrate module 38 through a metal wire (so-called bonding wire) 44. Although not shown, besides the solid-state imaging device chip 34, chip parts of necessary circuit elements (for example, a resistance element, a capacitive element, etc.) may be mounted on the substrate module 38. In the substrate module 38, although not shown, electrode pads connected with the circuit wiring 36 are formed on the rear side by means of a multi-layered wiring structure. The circuit wiring 36 is formed in this example by means of a laminated structure of a Cu film, an Ni film, and an Au film laminated in this order from the substrate side.

The cover body 41 is in a cup-like shape of an inverted letter U in cross section, and the opening 42 through which an incident light enters is formed in the center of the upper wall part, that is, in the position opposing the imaging surface of the imaging region 45 of the solid-state imaging device chip 34. The optically transparent member 32 is formed of a member capable of optical transmission such as glass, plastic, etc. The optically transparent member 32 may be also formed of a member having an optical element function, such as an infrared cut filter, an optical lens through a lens tube, etc. In this example, the optically transparent member 32 is constituted of an infrared cut filter.

Further, in this embodiment, as illustrated in FIG. 3, an adhesive layer 47 is formed on the internal surface of the package 33 for causing a minute foreign substance such as dust, etc. to adhere to, and also a penetration hole 49 connecting to an open space 48 in the package 33 is formed in the bottom part of the package 33, that is, in the insulating substrate 37 of the substrate module 38.

In the illustrated example, the adhesive layer 47 is formed on the whole surface of the internal wall of the cover body 41, on the surface other than the solid-state imaging device chip 34 of the substrate module 38, and on the region other than the imaging surface of the imaging region 45 of the solid-state imaging device chip 34. The penetration hole 49 is formed in the position immediately below the solid-state imaging device chip 34, preferably in the position immediately below the center of the solid-state imaging device chip 34. Here, a gap 50 is formed between the insulating substrate 37 and the solid-state imaging device chip 34 by a thickness t1 of the bond layer 46 existing between the insulating substrate 37 of the substrate module 38 and the solid-state imaging device chip 34. The penetration hole 49 and the open space 48 in the package 33 are communicated through this gap 50.

It is preferable that the penetration hole 49 is formed to have a diameter that enables discharging of gas, ion, etc. exhausted from the adhesive layer 47 and that also enables preventing a foreign substance from outside such as dust, etc. from entering. That is, the diameter of the penetration hole 49 is made in a size that is sufficiently small relative to the foreign substance such as dust, etc. and that can discharge only a gas component. However, when it is difficult to make the diameter of the penetration hole 49 small such as to prevent entrance of a foreign substance due to a limitation in processing accuracy, it may be configured to control the gap 50 formed between the substrate module 38 and the solid-state imaging device chip 34, i.e., the thickness t1 of the bond layer 46, such that the entrance of the foreign substance from outside is prevented by the gap 50. In this example, as illustrated in FIG. 4B, the bond layer 46 is formed in a shape that a linear body 46a and a linear body 46b sandwich the penetration hole 49 and oppose each other on both sides thereof.

From the viewpoint of air permeability described later and prevention of entrance of dust from outside, it is preferable that a length $L_1$ of each of the linear body 46a and the linear body 46b and a gap $W_1$ between the linear body 46a and the linear body 46b are set to satisfy $L_1 > W_1$.

Figure 5:
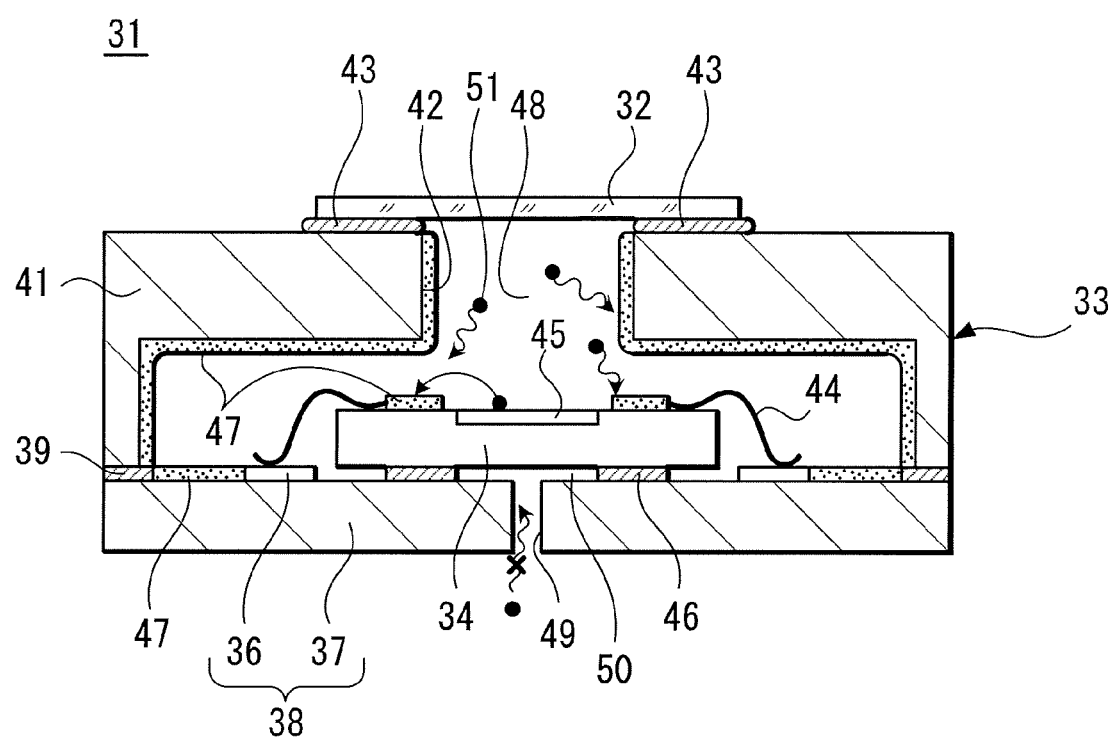
FIG. 5 is an explanatory diagram for explaining behavior of a foreign substance such as dust in the package-type solid-state imaging apparatus.

According to the solid-state imaging apparatus 31 according to the above-described embodiment of the invention, because the adhesive layer 47 is formed on the surface of the internal wall of the cover body 41 constituting the package 33, on the surface exposed to the open space 48 of the substrate module 38, and on the region other than the imaging surface of the solid-state imaging device chip 34, a minute foreign substance such as dust, etc. entered into the package 33 or generated in the package 33 is caused to adhere to the adhesive layer 47 when the foreign substance is moved due to vibration, shock, etc. FIG. 5 illustrates behavior of a foreign substance such as dust, etc. A foreign substance 51 such as dust, etc. in the package 33 is moved by vibration, shock, etc. and is thereby caused to adhere to the adhesive layer 47 to be then fixed, so that the probability that the foreign substance 51 adheres to the imaging surface of the solid-state imaging device chip 34 is remarkably decreased, and substantively it is prevented that the foreign substance 51 adheres to the imaging surface of the solid-state imaging device chip 34.

Figure 6A:
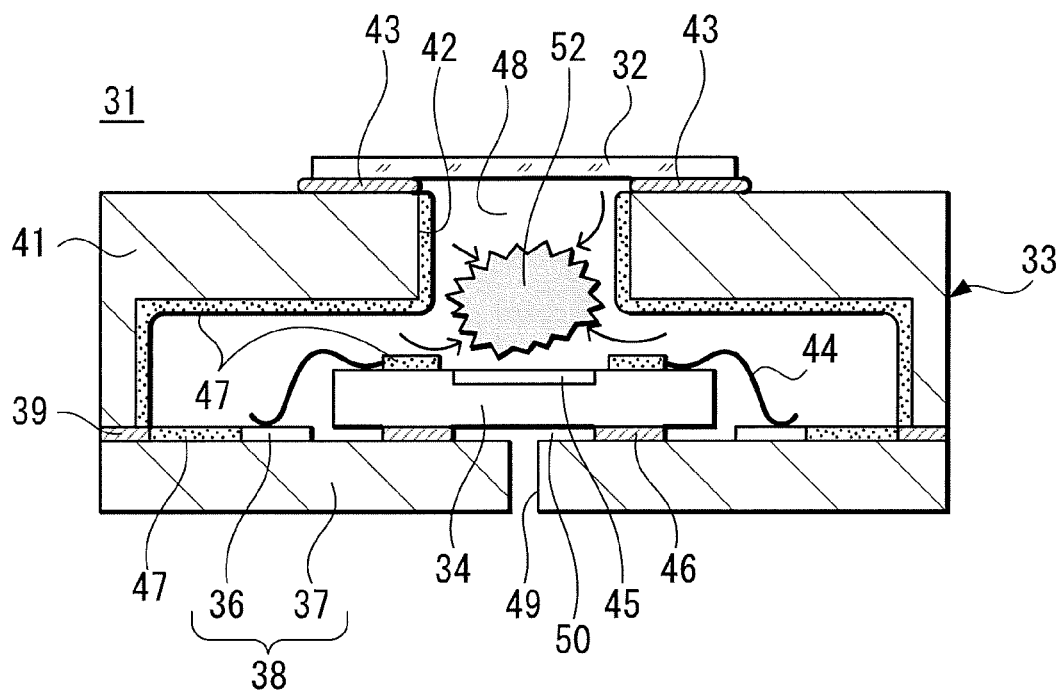
FIG. 6A and FIG. 6B are explanatory diagrams for explaining behavior of gas and ion in the package-type solid-state imaging apparatus.
Figure 6B:
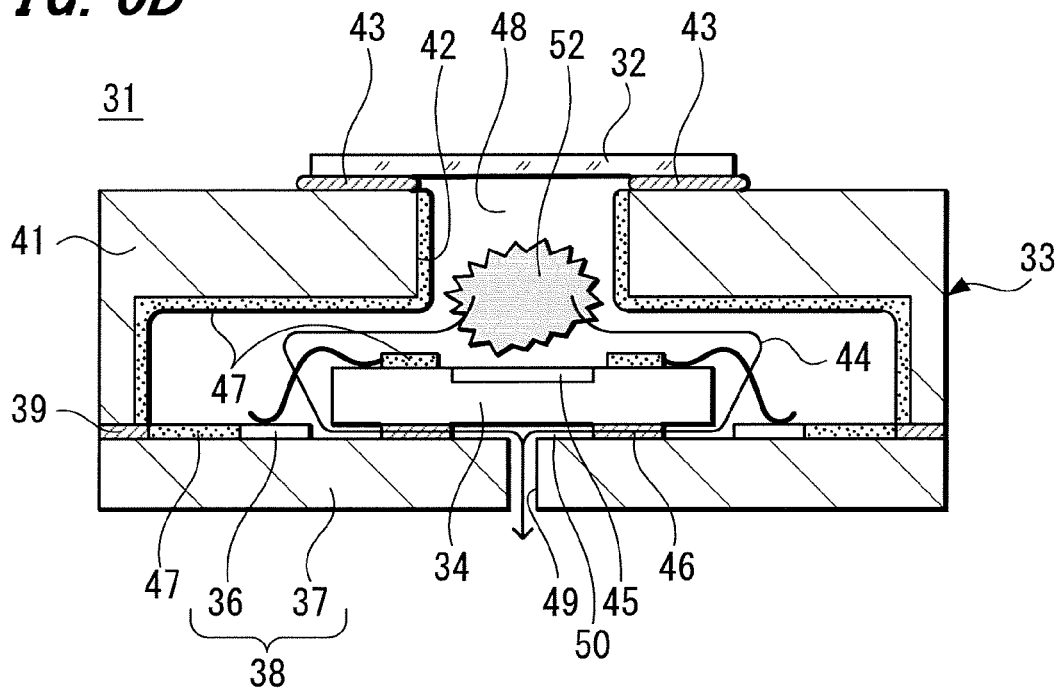

On the other hand, when gas and ion have been generated from the adhesive layer 47 in the package 33 due to a change in the environment such as a change to a high temperature and high humidity condition, the generated gas and ion are discharged from the open space 48, without staying in the open space 48, through the gap 50 between the substrate module 38 and the solid-state imaging device chip 34, and through the penetration hole 49 formed in the substrate module 38, to outside. FIG. 6A and FIG. 6B illustrate behavior of the gas and ion. A gas 52 such as ion, gas, etc. is exhausted from the adhesive layer 47 due to an environmental change (see FIG. 6A). The generated gas 52 such as gas, ion, etc. is discharged to outside of the package 33 through the penetration hole 49 provided in the substrate module 38. Thereby, erosion due to the generated ion and gas in the electrode pad on the side of the solid-state imaging device chip 34 and in the circuit wiring 36 on the side of the substrate module 38 can be prevented.

The gas generated from the adhesive layer 47 is a gas containing organic acid ion (formic acid, acetic acid) and halide ion. Because these organic acid ion and halide ion are negatively charged, if they are absorbed by the water slightly existing on the substrate module 38, they are particularly attracted by the energized power source wiring in a concentrated manner and cause a redox reaction to make erosion notably. In this embodiment, such erosion in the power source wiring can be prevented.

Further, because the diameter of the penetration hole 49 is set to a dimension sufficient to prevent entry of a minute foreign substance such as dust, etc. or the gap 50 between the solid-state imaging device chip 34 and the substrate module 38 is set to a dimension sufficient to prevent entry of a foreign substance, it is possible to prevent entry of a foreign substance from outside into the open space 48 of the package 33. When the bond layer 46 between the solid-state imaging device chip 34 and the substrate module 38 is formed in such a shape that the length $L_1$ of each of the linear body 46a and the linear body 46b and the gap $W_1$ between the linear body 46a and the linear body 46b satisfy $L_1 > W_1$, entry of a foreign substance from outside is prevented by the region surrounded by the linear body 46a and the linear body 46b, and at the same time discharging of gas and ion is enabled. Accordingly, the reliability and the durability of the package-type solid-state imaging apparatus can be greatly improved.

Figure 7A:
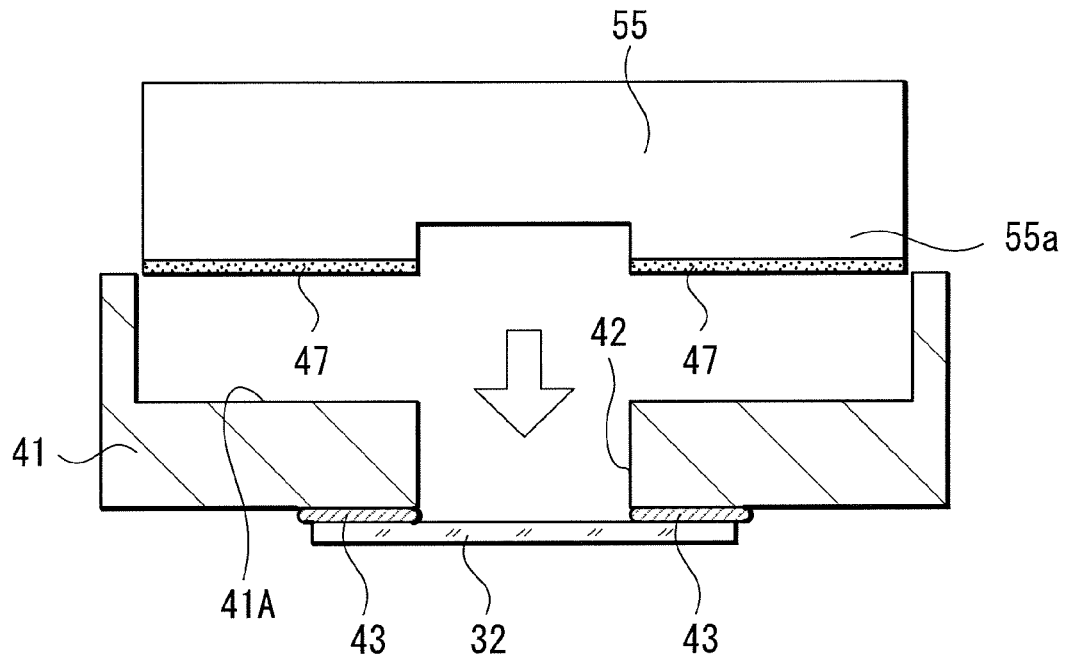
FIG. 7A and FIG. 7B are explanatory diagrams for explaining an example of a transfer method of forming an adhesive layer in the package-type solid-state imaging apparatus.
Figure 7B:
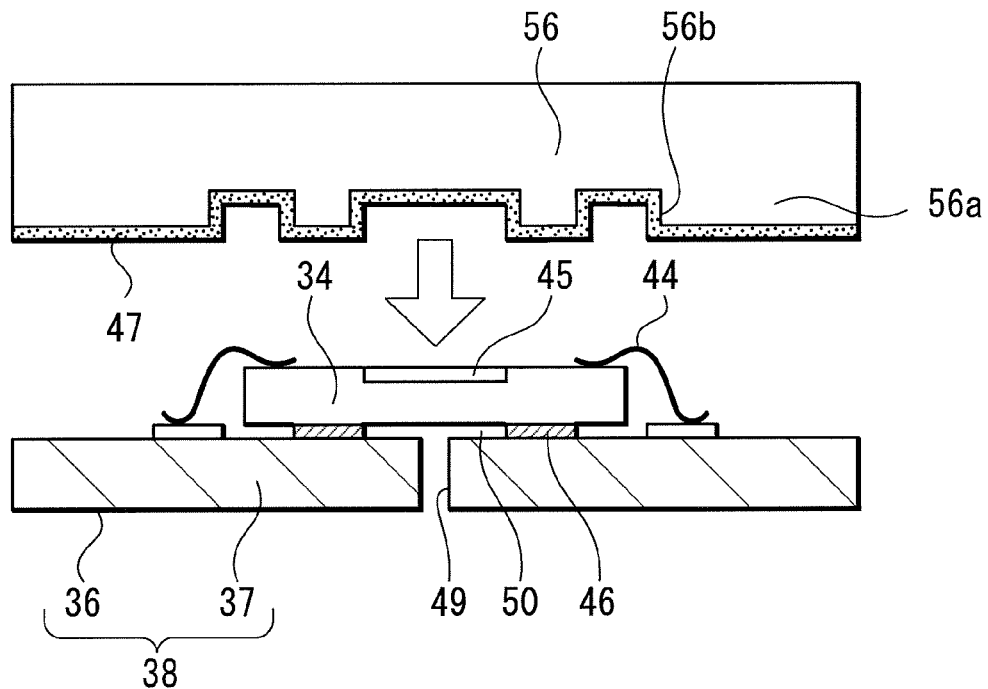

FIG. 7A and FIG. 7B illustrate an example of a method of forming the adhesive layer 47 on the internal surface of the cover body 41, on the surface of the substrate module 38, and on the surface other than the imaging surface of the solid-state imaging device chip 34. In this example, a transfer method is used. When coating the adhesive layer 47 on the internal surface of the cover body 41, as illustrated in FIG. 7A, a transfer pin 55 having an exterior shape to be inserted into the cover body 41 is provided. The transfer pin 55 is formed such that the portion corresponding to the opening 42 of the cover body 41 is in a concave shape and the portion corresponding to the internal surface of the cover body 41, to which the adhesive layer 47 is to be transferred, that is, in this example the upper internal wall surface of the cover body 41, is in a convex shape. The adhesive layer 47 is uniformly coated on the surface of a convex-shaped part 55a of the transfer pin 55. In a state that the cover body 41, to which the optically transparent member 32 has been connected so as to close the opening 42, is reversed and is placed on a placement table, the transfer pin 55, to which the adhesive layer 47 has been coated, is pressed from above so as to contact an upper internal wall surface 41A of the cover body 41 and thereby the adhesive layer 47 is transferred to the upper internal wall surface 41A of the cover body 41.

When coating the adhesive layer 47 on the surfaces of the solid-state imaging device chip 34 and the substrate module 38, as illustrated in FIG. 7B, a transfer pin 56 is provided, in which each portion to which the adhesive layer 47 is to be transferred is formed in a convex shape and the other portions are formed in concave shapes. The adhesive layer 47 is uniformly coated on the whole surface including a convex part 56a and a concave part 56b of the transfer pin 56. On the other hand, the solid-state imaging device chip 34 is mounted on the substrate module 38. Then, in a state that the substrate module 38 on which the solid-state imaging device chip 34 has been mounted is placed and fixed on the placement table, the transfer pin 56 on which the adhesive layer 47 has been coated is pressed from above so as to contact the surface other than the imaging surface of the solid-state imaging device chip 34 and the surface of the substrate module 38, and thereby the adhesive layer 47 is transferred to the necessary surfaces of the solid-state imaging device chip 34 and the substrate module 38.

As the method of forming the adhesive layer 47 on the internal surface of the cover body 41, on the surface of the substrate module 38, and on the surface other than the imaging surface of the solid-state imaging device chip 34, another method other than the above-described transfer method, for example, a coating method using a needle, etc. may be used.

By adopting the above-described transfer method, as compared with the method using a needle or the method using a spray, coating in a relatively short period of time becomes possible, and the productivity can be improved.

Figure 8:
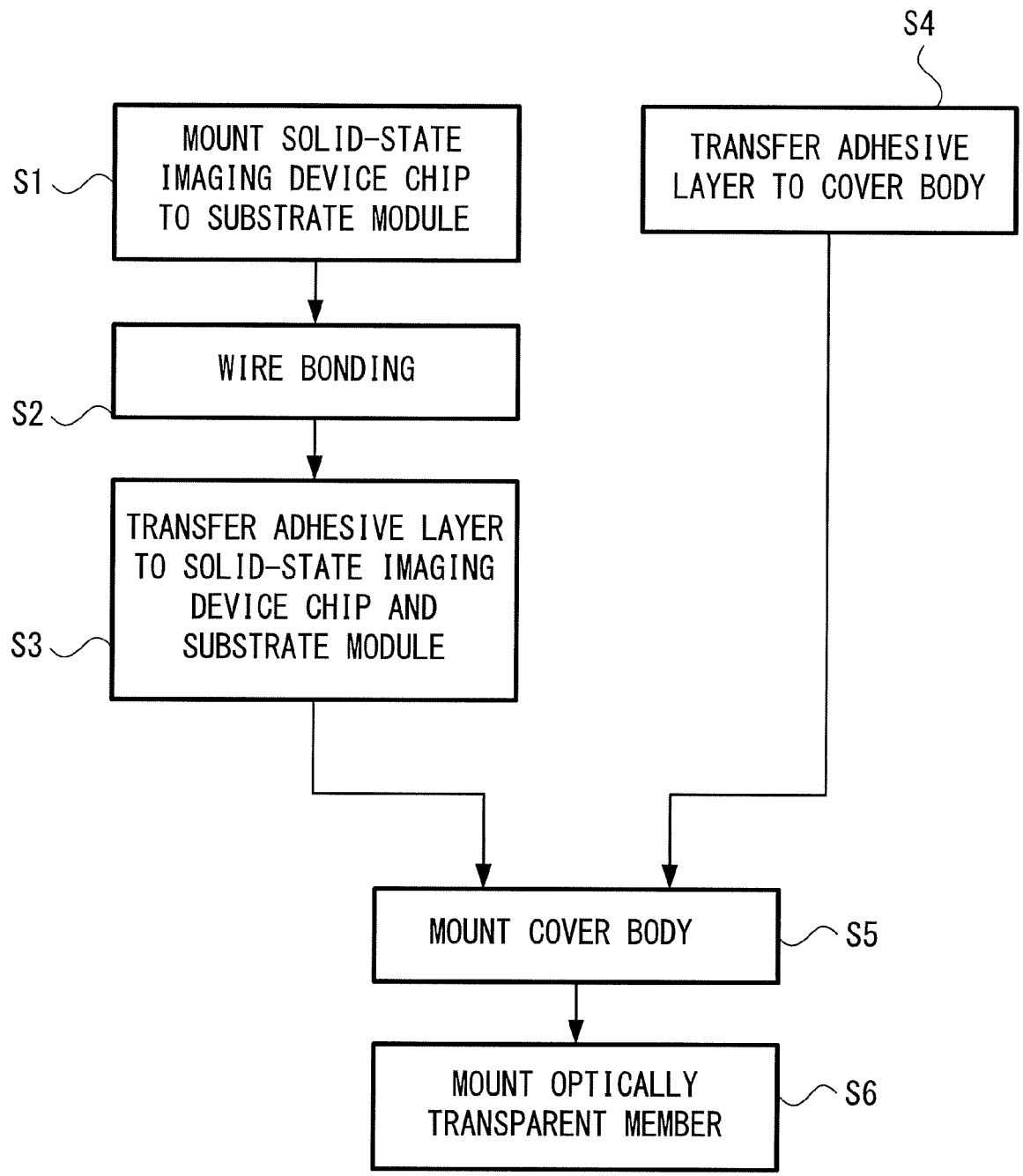
FIG. 8 is a flowchart of an example of a production method of the package-type solid-state imaging apparatus.

FIG. 8 illustrates a flowchart of an example of a production method of the solid-state imaging apparatus 31 according to the above-described embodiment. First, as indicated in step S1, the solid-state imaging device chip 34 is mounted to the substrate module 38 through the bond layer 46. Next, as indicated in step S2, by means of wire bonding, the electrode pad of the solid-state imaging device chip 34 and the circuit wiring 36 of the substrate module 38 are electrically connected. Next, as indicated in step S3, the adhesive layer 47 is coated to the necessary surfaces of the solid-state imaging device chip 34 and the substrate module 38 by means of the above-described transfer method.

On the other hand, as indicated in step S4, the adhesive layer 47 is coated to the internal surface of the cover body 41 with the above-described transfer method. Then, as indicated in step S5, the cover body 41 is mounted to the substrate module 38 to be connected through the bond layer 39. Subsequently, as indicated in step S6, the optically transparent member 32 such as a glass or an infrared cut filter is connected with the cover body 41 so as close the opening 42 through the bond layer 43, and thereby the desired solid-state imaging apparatus 31 is obtained.

In the production method of the solid-state imaging apparatus 31 in FIG. 8, the optically transparent member 32 is connected in the last step of the production. In an ordinary hermetically sealed package, the internal air pressure is increased, so that the probability of occurrence of failure that the optically transparent member 32 floats is increased and the yield is decreased. However, in this embodiment, because the penetration hole 49 is provided in the bottom part of the package 33, in this example, in the substrate module 38, the pressure within the package 33 is adjusted, so that floating of the optically transparent member 32 is prevented, and production at a relatively high yield becomes possible.

FIG. 9A through FIG. 9G, FIG. 10H through FIG. 10L, and FIG. 11 illustrate another example of the production method of the solid-state imaging apparatus 31 according to the above-described embodiment.

Figure 9A:
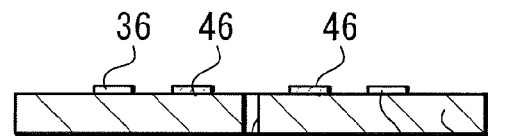
FIG. 9A through FIG. 9G are production process diagrams illustrating a first part of another example of the production method of the package-type solid-state imaging apparatus.

First, as illustrated in FIG. 9A, the bond layer 46 (including the linear body 46a and the linear body 46b as illustrated in FIG. 4B), which is, in this example, a die bond paste, is coated to the portion of the insulating substrate 37 of the substrate module 38, to which the solid-state imaging device chip 34 is to be mounted. As described above, the penetration hole 49 has been formed in the center part of the insulating substrate 37 and the circuit wiring 36 of a predetermined pattern has been formed on the surface of the insulating substrate 37.

Figure 9B:
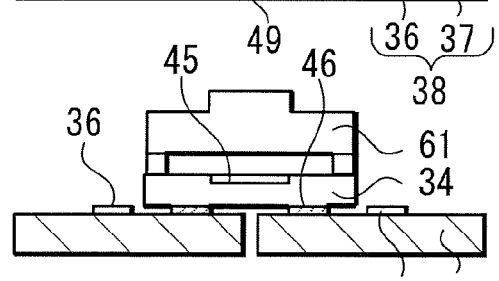

Next, as illustrated in FIG. 9B, the solid-state imaging device chip 34 held by a holding device 61 is bonded onto the bond layer 46 on the substrate module 38.

Figure 9C:
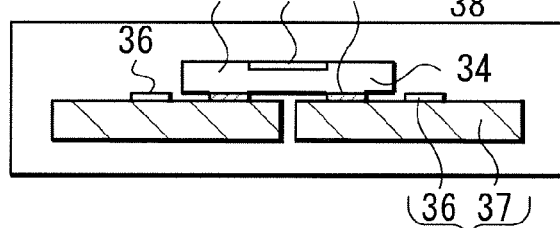

Next, as illustrated in FIG. 9C, the bond layer 46 is hardened.

Figure 9D:
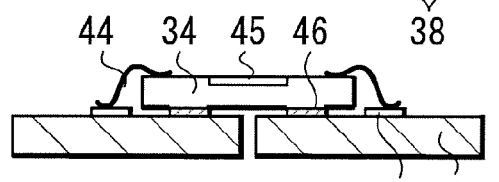

Next, as illustrated in FIG. 9D, wire bonding is carried out, and the electrode pad of the solid-state imaging device chip 34 and the circuit wiring 36 of the substrate module 38 are electrically connected through the metal wire 44.

Figure 9E:
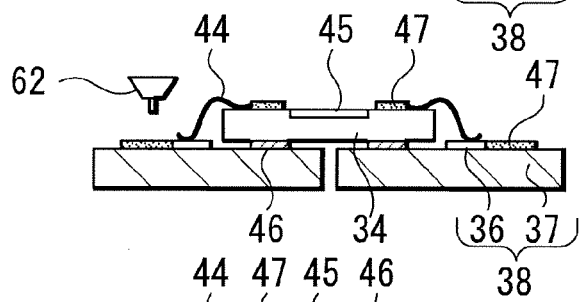

Next, as illustrated in FIG. 9E, the adhesive layer 47 is coated on the surface other than the imaging surface of the solid-state imaging device chip 34 and the surface of the substrate module 38 for example through a needle 62 or by means of the above-described transfer method.

Figure 9F:
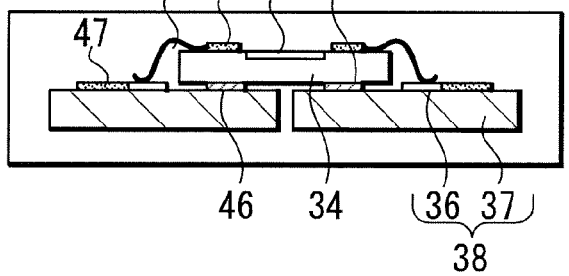

Next, as illustrated in FIG. 9F, the coated adhesive layer 47 is hardened with ultraviolet rays or by means of drying.

Figure 9G:
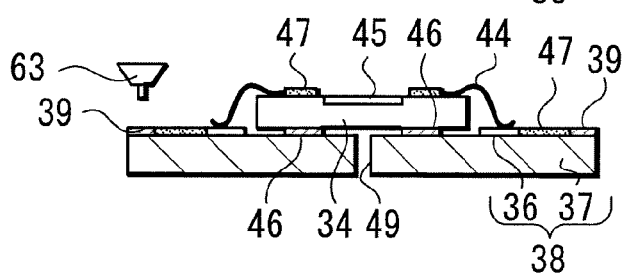

Then, as illustrated in FIG. 9G, for example through a needle 63, the bond layer 39 is coated on the periphery surface of the substrate module 38.

Figure 10H:
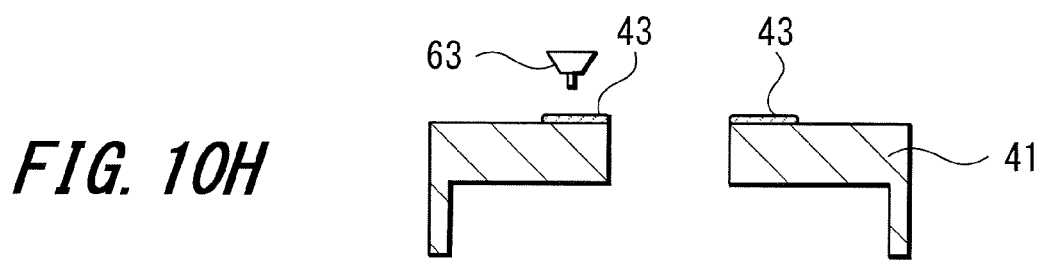
FIG. 10H through FIG. 10L are production process diagrams illustrating a second part of the example of the production method of the package-type solid-state imaging apparatus.

On the other hand, as illustrated in FIG. 10H, the bond layer 43 for bonding the optically transparent member 32 is coated on the upper surface of the peripheral part of the opening 42 of the cover body 41.

Figure 10I:
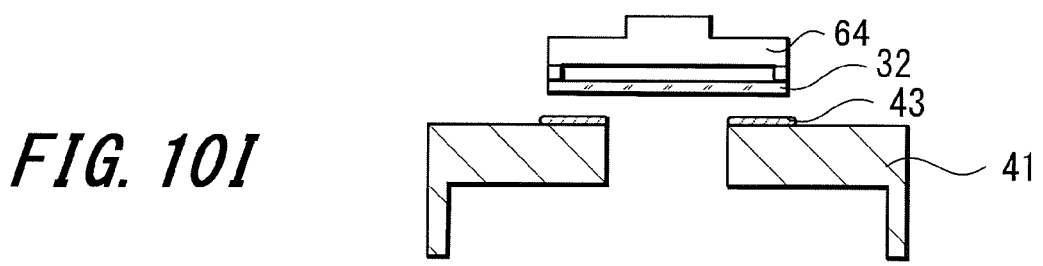
Figure 10J:
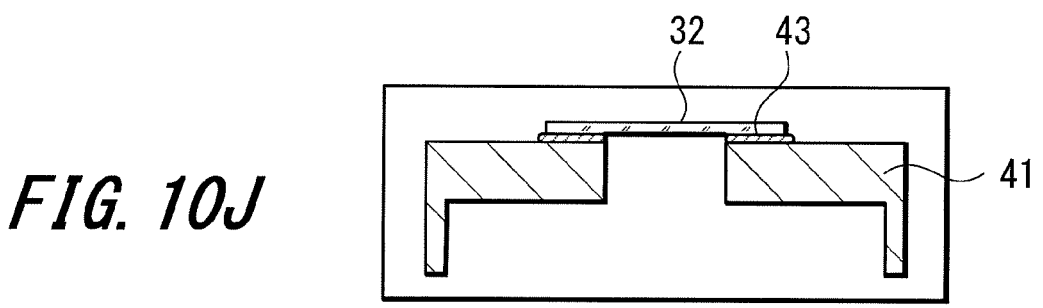
Figure 10K:
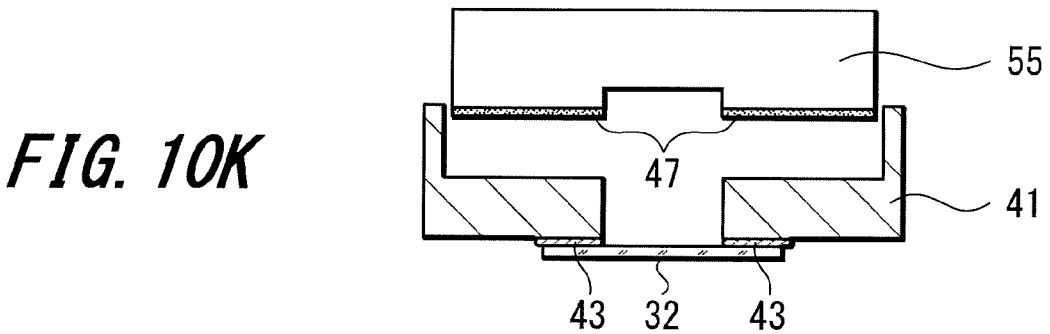

Then, as illustrated in FIG. 10I, the optically transparent member 32 held by a holding device 64 is placed on the bond layer 43 on the cover body 41.

Next, as illustrated in 10J, the bond layer 43 is hardened, and the optically transparent member 32 is hermetically connected with the cover body 41.

Next, as illustrated in 10K, the cover body 41 to which the optically transparent member 32 has been connected is reversed, and using the transfer pin 55 to which the adhesive layer 47 has been coated, the adhesive layer 47 is coated on the internal surface of the cover body 41.

Figure 10L:
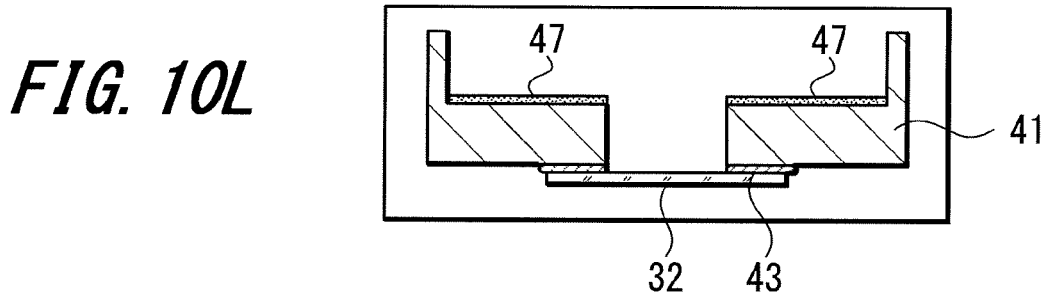

Next, as illustrated in FIG. 10L, the adhesive layer 47 is hardened for example with ultraviolet rays or by means of drying.

Next, as illustrated in FIG. 11, the substrate module 38 on which the solid-state imaging device chip 34 has been mounted (illustrated in the upper left part in figure), which is obtained in the step of FIG. 9G, and the cover body 41 connected with the optically transparent member 32 (illustrated in the upper right part in figure), which is obtained in the step of FIG. 10L, are joined together through the bond layer 39 coated to the periphery of the substrate module 38, the bond layer 39 is hardened, and thereby the desired solid-state imaging apparatus 31 (illustrated in the lower center part in figure) is obtained. Note that in FIG. 11, the adhesive layer 47 on the internal surface of the cover body 41 is formed by means of the transfer method of FIG. 7A, so that the adhesive layer 47 is formed only on the upper internal surface of the cover body 41.

Figure 12A:
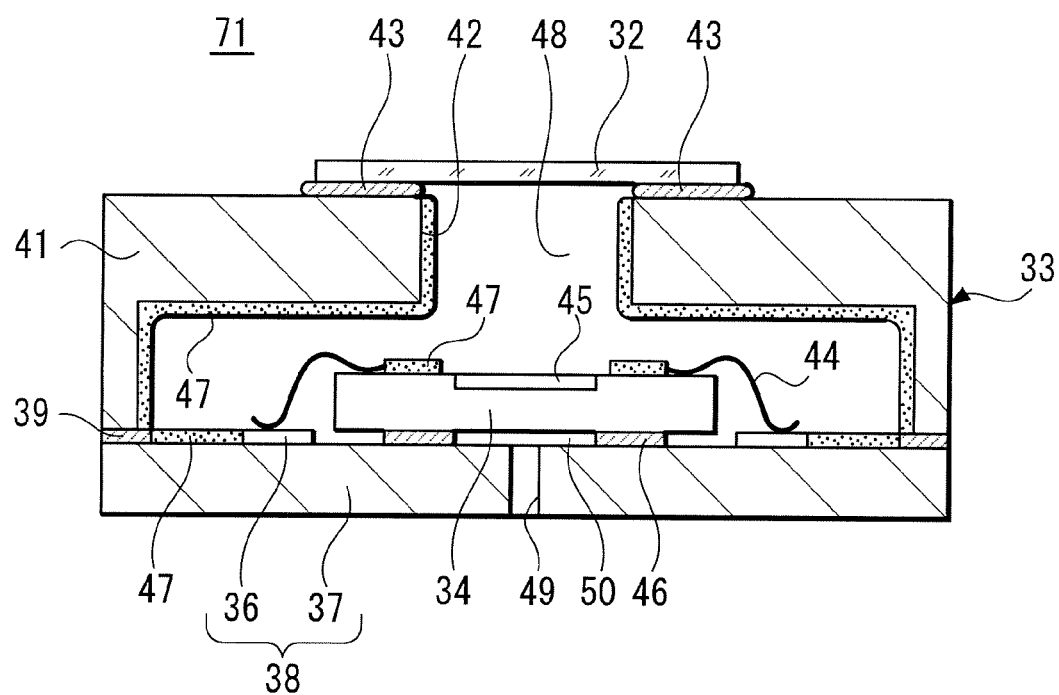
FIG. 12A is a schematic configuration diagram of an example of a package-type solid-state imaging apparatus according to another embodiment of the invention.
Figure 12B:
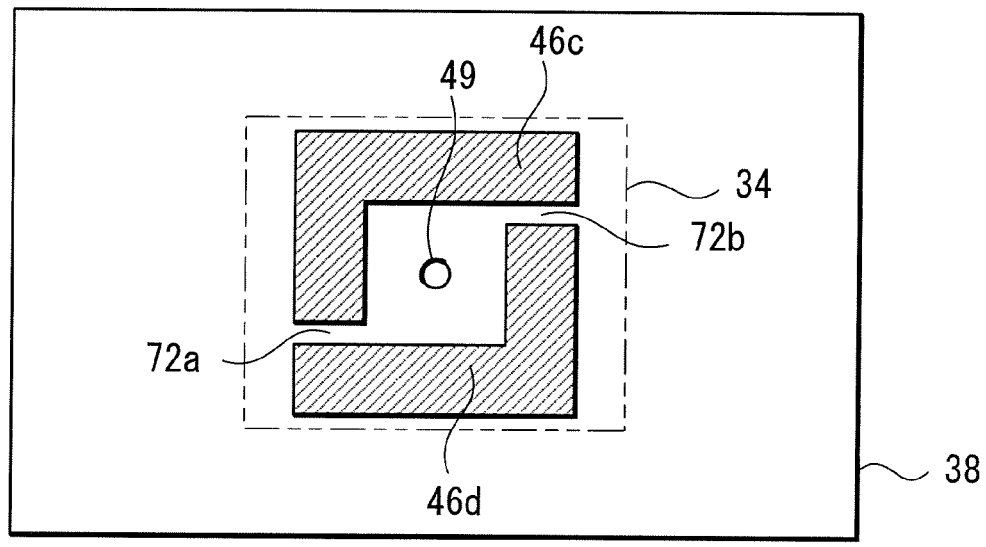
FIG. 12B is a plain view illustrating a shape of a bond layer bonding a solid-state imaging device chip and a substrate module of the package-type solid-state imaging apparatus of FIG. 12A.

FIG. 12A and FIG. 12B illustrate an example of a package-type solid-state imaging apparatus according to another embodiment of the invention. A solid-state imaging apparatus 71 is configured differently from the solid-state imaging apparatus 31 of the above-described embodiment with respect to the shape of the bond layer 46 bonding the substrate module 38 and the solid-state imaging device chip 34. In this embodiment, the bond layer 46 is formed in a shape surrounding the penetration hole 49 and having a communication hole formed in a part thereof.

For example, the adhesive layer 46 intervening between the substrate module 38 and the solid-state imaging device chip 34 is formed in a planar view in a shape that an L-like member 46c and an L-like member 46d surround the penetration hole 49 and oppose each other with small gaps 72a and 72b between them. That is, the L-shaped member 46c and the L-shaped member 46d are arranged so as to form a quadrangle surrounding the penetration hole 49 and to have the gap 72a and the gap 72b at two diagonal corners thereof. Each of the gap 72a and the gap 72b become the communicating hole. Note that although not shown, the adhesive layer 46 may be formed in a shape that two U-shaped or arc-like bodies are arranged to surround the penetration hole 49 and to oppose each other with small gaps (which become communication holes) between them.

The configuration of the other parts of the solid-state imaging apparatus 71 is the same as that of the solid-state imaging apparatus 31 of the previous embodiment illustrated in FIG. 3, so that the parts corresponding to those in FIG. 3 are denoted by the same reference symbols and overlapped description is omitted.

According to the solid-state imaging apparatus 71 according to this embodiment, as in the previously described embodiment, because the adhesive layer 47 is formed on the surface of the internal wall of the cover body 41, on the surface of the substrate module 38, and on the surface other than the imaging surface of the solid-state imaging device chip 34, a minute foreign substance such as dust, etc. in the package 33 is caused to adhere to the adhesive layer 47 also when the foreign substance is moved due to vibration, shock, etc., so that it is practically prevented that the foreign substance adheres to the imaging surface of the solid-state imaging device chip 34. Further, because the penetration hole 49 is provided in the substrate module 38, even when gas and ion have been generated from the adhesive layer 47 due to an environmental change, the generated gas and ion are discharged to outside through the penetration hole 49, and erosion of the circuit wiring 36 and the electrode pad in the package 33 is prevented.

Further, because the bond layer 46 between the solid-state imaging device chip 34 and the substrate module 38 is formed in a quadrangle shape surrounding the penetration hole 49 in a planar view and having the small gaps 72a and 72b at two diagonal corners thereof, the entrance of a foreign substance from outside into the open space 48 is further prevented. That is, even if the foreign substance has entered from outside through the penetration hole 49, the foreign substance is stopped by the small gaps 72a and 72b of the bond layer 46 in the quadrangle shape and the entry of the foreign substance into the open space 48 is prevented. The same applies to the case that the bond layer 46 is formed of two U-shaped or arc-like bodies.

Thus, according to this embodiment, the reliability and the durability of a package-type solid-state imaging apparatus can be remarkably increased.

Figure 13:
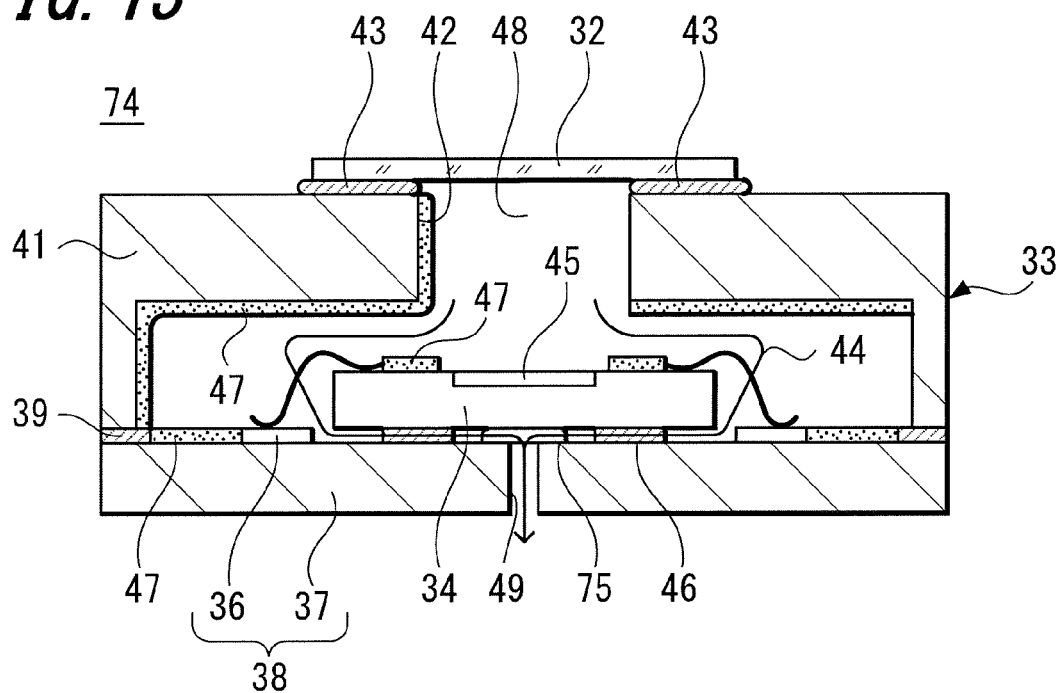
FIG. 13 is a schematic configuration diagram illustrating an example of a package-type solid-state imaging apparatus according to another embodiment of the invention.

FIG. 13 illustrates an example of a package-type solid-state imaging apparatus according to another embodiment of the invention. A solid-state imaging apparatus 74 according to this embodiment is configured to include an air permeable filter that has the air permeability and that can yet prevent the entry of a foreign substance such as dust, etc. from outside, in this example, an air permeable resin layer 75, formed on the surface of the insulating substrate 37 so as to close the penetration hole 49 formed in the substrate module 38. For the air permeable resin layer 75, for example, a thermosetting resin in which a blowing agent has been mixed may be used as a porous air permeable resin. In this configuration, the place where the bond layer 46 intervening between the solid-state imaging device chip 34 and the substrate module 38 is arranged is not limited in particular. The bond layer 46 may be formed in a shape similar to the one illustrated in FIG. 3 or FIG. 12.

The configuration of the other parts of the solid-state imaging apparatus 74 is the same as that of the solid-state imaging apparatus 31 of the previous embodiment illustrated in FIG. 3, so that the parts corresponding to those in FIG. 3 are denoted by the same reference symbols and overlapped description is omitted.

According to the solid-state imaging apparatus 74 according to this embodiment, because the adhesive layer 47 is formed on the surface of the internal wall of the cover body 41, on the surface of the substrate module 38, and on the surface other than the imaging surface of the solid-state imaging device chip 34, a minute foreign substance such as dust, etc. in the package 33 is caused to adhere to the adhesive layer 47 also when the foreign substance is moved due to vibration, shock, etc., so that practically it is prevented that the foreign substance adheres to the imaging surface of the solid-state imaging device chip 34. Further, because the penetration hole 49 is provided in the substrate module 38 and also the air permeable resin layer 75, which is a kind of an air permeable filter having the air permeability and yet capable of preventing the entrance of a foreign substance, is provided so as to close the penetration hole 49, even when gas and ion have been generated from the adhesive layer 47 due to an environmental change, the generated gas and ion are discharged to outside through the penetration hole 49 and the air permeable resin layer 75, and erosion of the circuit wiring 36 and the electrode pad in the package 33 can be prevented.

Further, by closing the penetration hole 49 provided in the substrate module 38 with the air permeable resin layer 75, the reliability of preventing the entry of a foreign substance from outside is further increased, and the sense of reassurance can be increased even visually. By providing the air permeable resin layer 75, the diameter of the penetration hole 49 can be made larger, and it becomes possible to decrease the technical barrier of forming a minute penetration hole.

Accordingly, according to this embodiment, the reliability and the durability of a package-type solid-state imaging apparatus can be remarkably increased.

Figure 14:
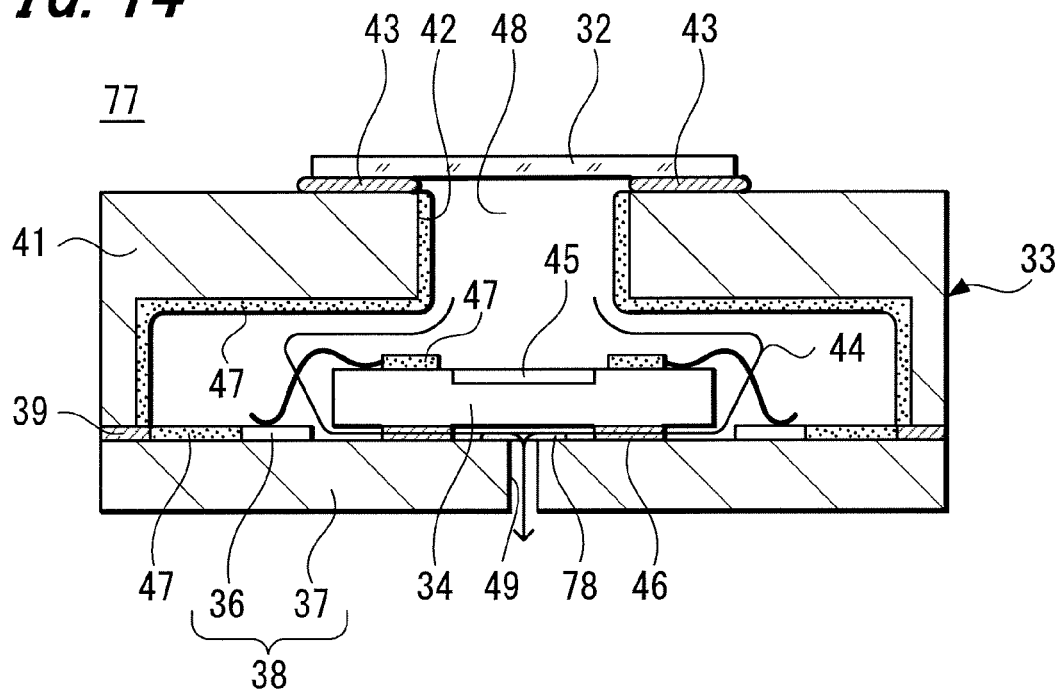
FIG. 14 is a schematic configuration diagram illustrating an example of a package-type solid-state imaging apparatus according to another embodiment of the invention.

FIG. 14 illustrates an example of a package-type solid-state imaging apparatus according to another embodiment of the invention, in which a variation of the above-described air permeable filter is used. A solid-sate imaging apparatus 77 according to this embodiment uses an air permeable tape 78 for the air permeable filter that closes the penetration hole 49 of the substrate module 38. As the air permeable tape 78, for example, an air permeable nonwoven sheet-like member, to which an adhesive has been coated, can be used.

The configuration of the other parts of the solid-state imaging apparatus 77 is the same as that of the solid-state imaging apparatus 74 of the previous embodiment illustrated in FIG. 13, so that the parts corresponding to those in FIG. 13 are denoted by the same reference symbols and overlapped description is omitted.

In the solid-state imaging apparatus 77 of this embodiment also, as in the previous embodiment illustrated in FIG. 13, because the adhesive layer 47 is formed on the surface of the internal wall of the cover body 41, on the surface of the substrate module 38, and on the surface other than the imaging surface of the solid-state imaging device chip 34, when a minute foreign substance such as dust, etc. in the package 33 is moved due to vibration, shock, etc. also, the foreign substance is caused to adhere to the adhesive layer 47, so that practically it is prevented that the foreign substance adheres to the imaging surface of the solid-state imaging device chip 34. Further, because the penetration hole 49 is provided in the substrate module 38 and also the air permeable tape 78, which is a kind of an air permeable filter having the air permeability and yet capable of preventing the entrance of a foreign substance, is provided so as to close the penetration hole 49, even when gas and ion have been generated from the adhesive layer 47 due to an environmental change, the generated gas and ion are discharged to outside through the penetration hole 49 and the air permeable tape 78, and erosion of the circuit wiring 36 and the electrode pad in the package 33 can be prevented.

Further, by closing the penetration hole 49 provided in the substrate module 38 with the air permeable tape 78, as in the previous embodiment, the reliability of preventing the entry of a foreign substance from outside is further increased, and the sense of reassurance can be increased even visually. By providing the air permeable tape 78, the diameter of the penetration hole 49 can be made larger, and it becomes possible to decrease the technical barrier of forming a minute penetration hole. Further, because the air permeable tape 78 can close the penetration hole 49 by causing it to be adhered to the surface of the insulating substrate 37, the production can be simplified.

Thus, according to this embodiment, the reliability and the durability of a package-type solid-state imaging apparatus can be remarkably increased.

Figure 15A:
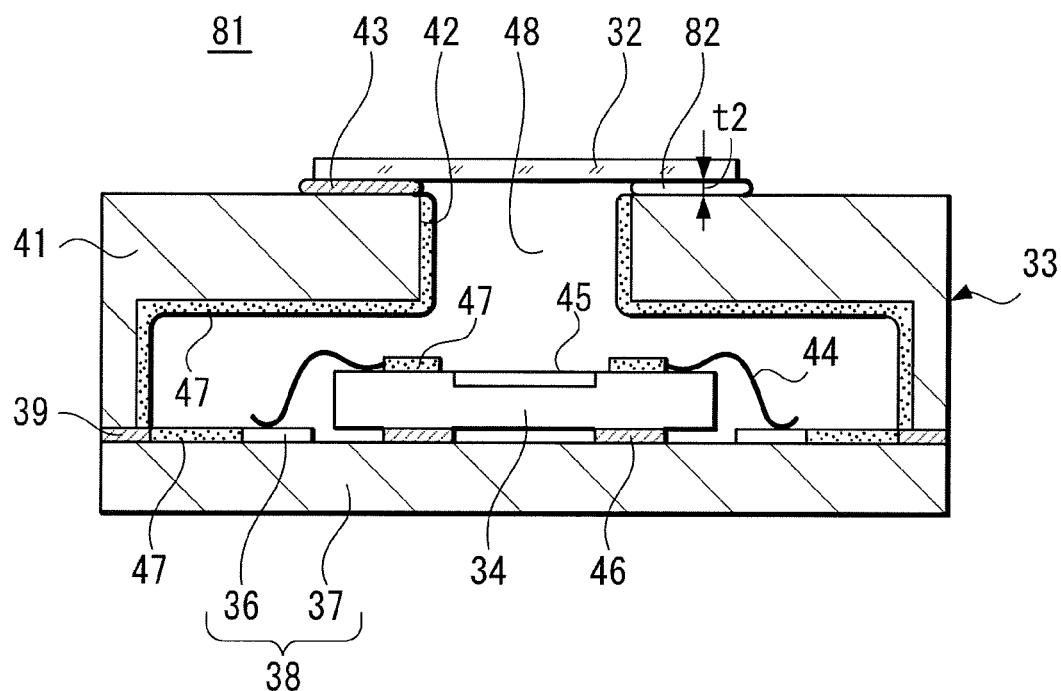
FIG. 15A is a schematic configuration diagram illustrating an example of a package-type solid-state imaging apparatus according to another embodiment of the invention.
Figure 15B:
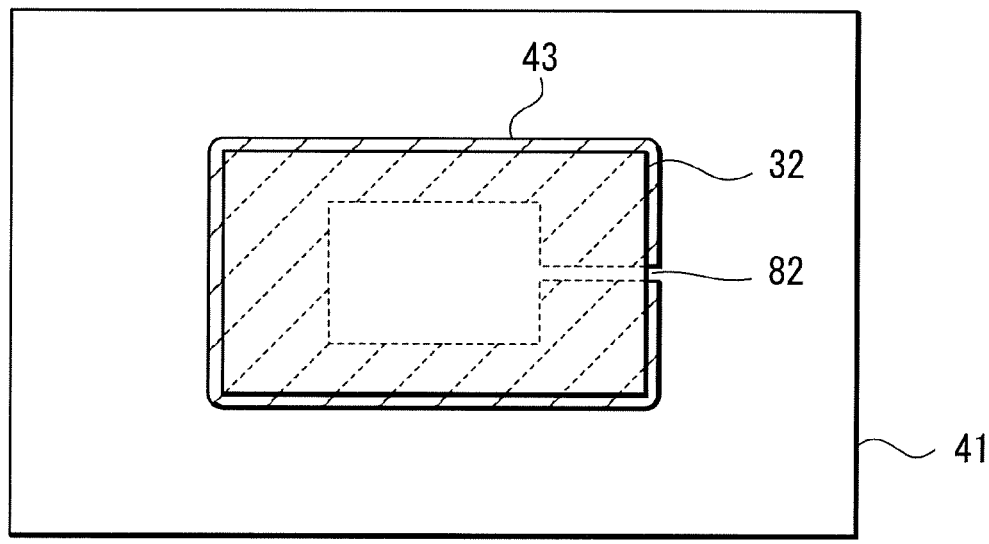
FIG. 15B is a top view of the package-type solid-state imaging apparatus of FIG. 15A.

FIG. 15A and FIG. 15B illustrate an example of a package-type solid-state imaging apparatus according to another embodiment of the invention. As in the previous embodiments, a solid-state imaging apparatus 81 includes the solid-state imaging device chip 34 enclosed in the package 33 having the optically transparent member 32. The package 33 includes the substrate module 38 in which the circuit wiring 36 is formed on the surface of the insulating substrate 37, the cover body 41 hermetically connected with the substrate module 38 through the bond layer 39, and the optically transparent member 32 hermetically connected with the cover body 41 through the bond layer 43 so as to close the opening 42 of the cover body 41. The electrode pad of the solid-state imaging device chip 34 and the circuit wiring 36 of the substrate module 38 are electrically connected through the metal wire 44.

Further, in this embodiment, the adhesive layer 47 is formed on the internal surface of the package 33, in this example, on the whole surface of the internal wall of the cover body 41, on the surface other than the solid-state imaging device chip 34 of the substrate module 38, and on the region other than the imaging surface of the imaging region 45 of the solid-state imaging device chip 34. The penetration hole is not provided in the substrate module 38, and instead of the penetration hole, a slit-like vent 82 that causes the open space 48 in the package 33 to communicate with outside is formed in a part of a connection part of the optically transparent member 32 and the cover body 41, in this example, in a part of the bond layer 43. The vent 82 is formed in a size enabling discharging of gas and ion generated in the package 33 and capable of preventing the entry of a foreign substance such as dust, etc. from outside. The size of the vent 82 can be controlled, for example, by a thickness t2 of the bond layer 43.

The configuration of the other parts of the solid-state imaging apparatus 81 is substantially the same as that of the solid-state imaging apparatus 31 described with reference to FIG. 3, so that the detailed description thereof is omitted.

According to the solid-state imaging apparatus 81 of this embodiment, as in the previous embodiments, because the adhesive layer 47 is formed on the surface of the internal wall of the cover body 41, on the surface of the substrate module 38, and on the region other than the imaging surface of the solid-state imaging device chip 34, when a minute foreign substance such as dust, etc. in the package 33 is moved due to vibration, shock, etc. also, the foreign substance is caused to adhere to the adhesive layer 47, so that the foreign substance is substantially prevented from adhering to the imaging surface of the solid-state imaging device chip 34. Further, because the vent 82 by means of a slit is provided in the bond layer 43 bonding the optically transparent member 32 to the cover body 41, even when gas and ion have been generated from the adhesive layer 47 due to an environmental change, the generated gas and ion are discharged to outside through the vent 82, so that erosion of the circuit wiring 36 and the electrode pad in the package 33 is prevented. Accordingly, according to this embodiment, the reliability and the durability of a package-type solid-state imaging apparatus can be remarkably enhanced.

Figure 16A:
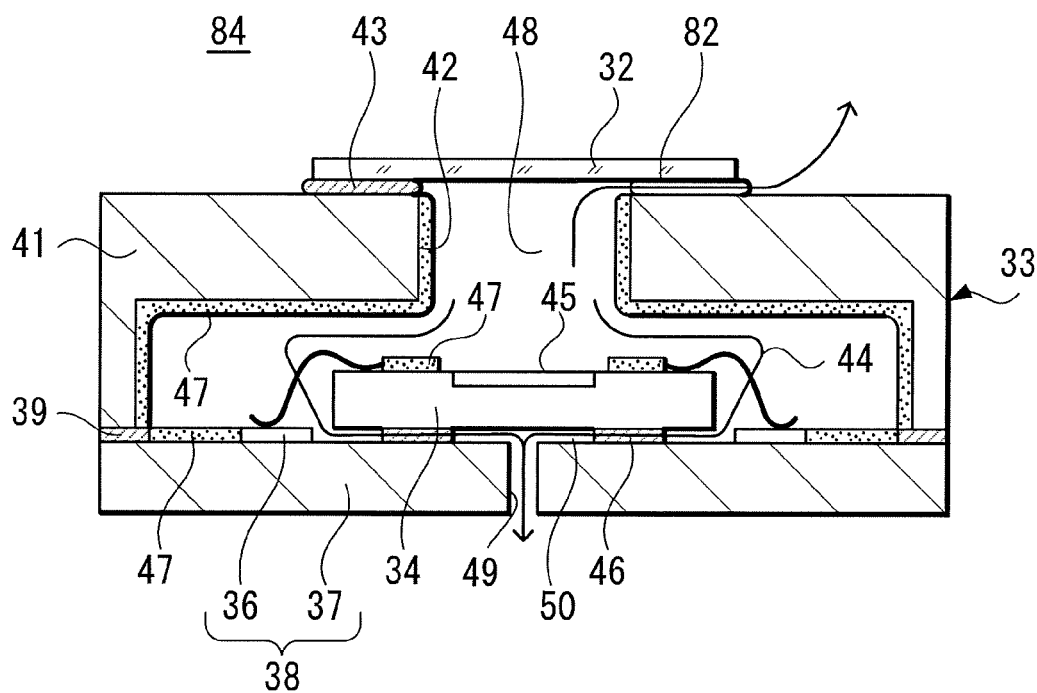
FIG. 16A is a schematic configuration diagram illustrating an example of a package-type solid-state imaging apparatus according to another embodiment of the invention.
Figure 16B:
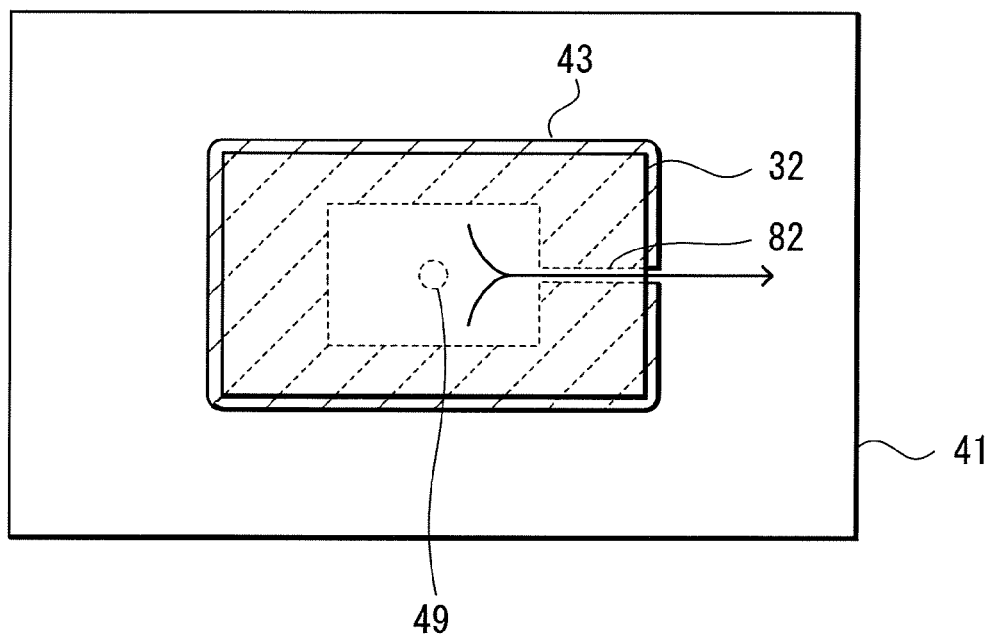
FIG. 16B is a top view of the package-type solid-state imaging apparatus of FIG. 16A.

FIG. 16A and 16B illustrate an example of a package-type solid-state imaging apparatus according to another embodiment of the invention. A solid-state imaging apparatus 84 according to this embodiment includes the adhesive layer 47 formed on the internal surface of the package 33, and the penetration hole 49 formed in the substrate module 38, which is the bottom part of the package 33, as in the solid-state imaging apparatus 31 illustrated in FIG. 3. The solid-state imaging apparatus 84 further includes the slit-like vent 82 formed in a part of a connection part of the optically transparent member 32 and the cover body 4, in this example, in the bond layer 43, as in the solid-state imaging apparatus 81 illustrated in FIG. 15A and FIG. 15B.

The configuration of the other parts of the solid-state imaging apparatus 84 is substantially the same as that of the solid-state imaging apparatuses 31 and 81 illustrated in FIG. 3 and FIG. 15A and FIG. 15B, so that the parts corresponding to those in FIG. 3 and FIG. 15A and FIG. 15B are denoted by the same reference symbols, and overlapped description is omitted.

According to the solid-state imaging apparatus 84 according to this embodiment, because the adhesive layer 47 is formed on the surface of the internal wall of the cover body 41, on the surface of the substrate module 38, and on the region other than the imaging surface of the solid-state imaging device chip 34, when a minute foreign substance such as dust, etc. in the package 33 is moved due to vibration, shock, etc. also, the foreign substance is caused to adhere to the adhesive layer 47, so that the foreign substance is substantially prevented from adhering to the imaging surface of the solid-state imaging device chip 34. Further, by providing the penetration hole 49 in the substrate module 38 and also the slit-like vent 82 in the connection part of the optically transparent member 32 and the cover body 41, it comes to have plural ventilation holes, so that the ventilation performance in the package 33 is enhanced, and even when gas and ion have been generated from the adhesive layer 47 due to an environmental change, the generated gas and ion are efficiently exhausted, and erosion of the circuit wiring 36 and the electrode pad in the package 33 can be prevented. With the provision of the vent 82 and the penetration hole 49 respectively serving as the ventilation holes in an upper part and a lower part in the package 33, the gas generated from the adhesive layer 47, that is lighter than the air, is exhausted from the slit-like vent 82 provided in the upper part, and the gas that is heavier than the air is exhausted from the penetration hole 49 provided in the lower part, and efficient exhausting of gas is enabled.

Accordingly, according to this embodiment, the reliability and the durability of a package-type solid-state imaging apparatus can be greatly enhanced.

Figure 17A:
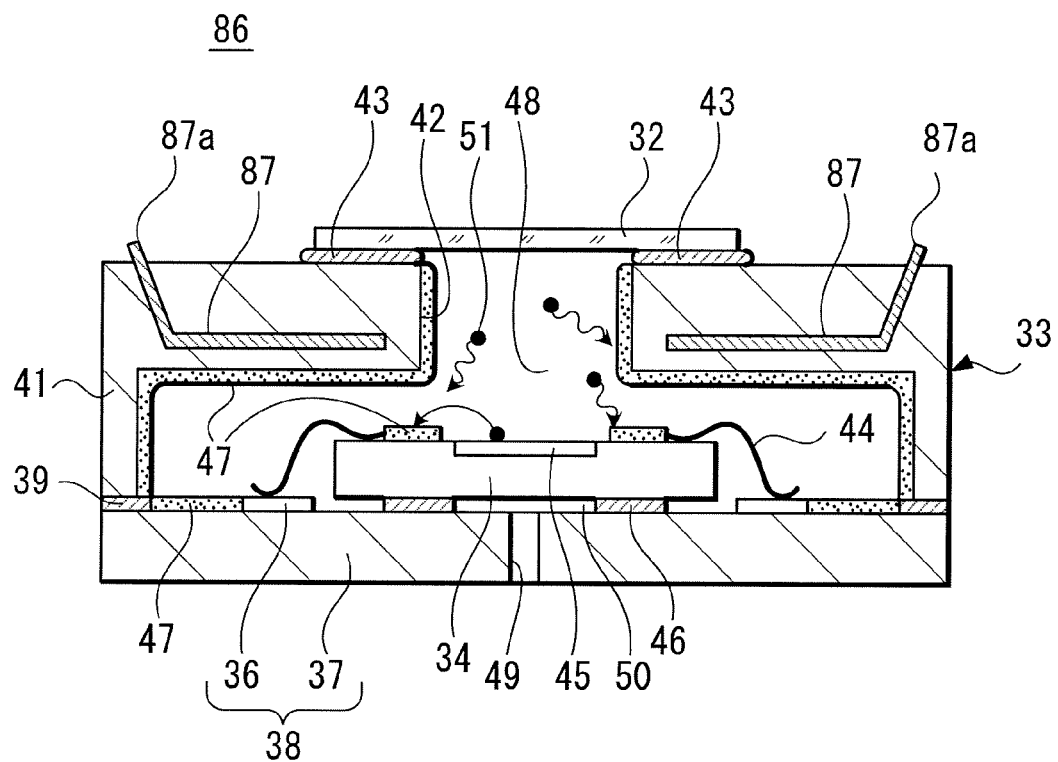
FIG. 17A is a schematic configuration diagram illustrating an example of a package-type solid-state imaging apparatus according to still another embodiment of the invention.
Figure 17B:
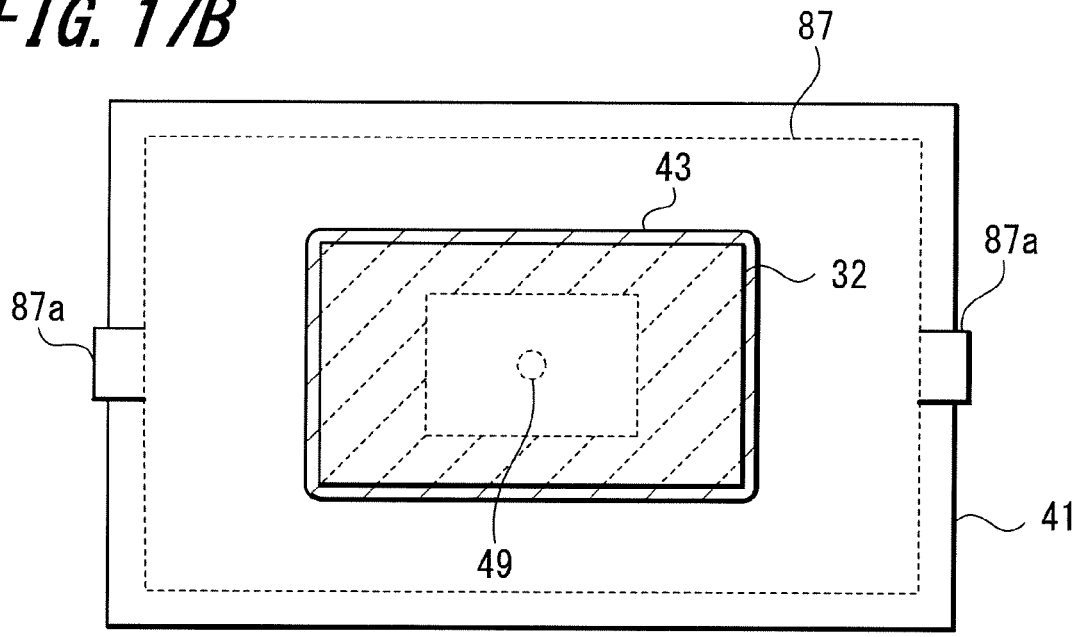
FIG. 17B is a top view of the package-type solid-state imaging apparatus of FIG. 17A.

FIG. 17A and FIG. 17B illustrate a package-type solid state imaging apparatus according to another embodiment of the invention. A solid-state imaging apparatus 86 includes an electrode member, to which a predetermined potential is applied for inducing a static charge in the cover body 41, in this example, an electrode plate 87 embedded in the cover body 41. The electrode plate 87 is preferably provided close to the internal wall surface of the cover body 41, that is, close to the internal wall surface on which the adhesive layer 47 has been formed. The electrode plate 87 may be formed of, for example, a metal plate. The electrode plate 87 is formed by means of insertion molding when molding the cover body 41. The electrode plate 87 is provided such that a part thereof is led out to outside as a lead terminal 87a. A predetermined potential is applied to the electrode plate 87 through the lead terminal 87a. In this example, when the gas generated from the adhesive layer 47 is ionized, it is negatively ionized, so that a positive voltage is applied to the electrode plate 87. When a positive ion is generated, a negative voltage is applied to the electrode plate 87. In the solid-state imaging apparatus 86 of this embodiment also, as in the example described with reference to FIG. 3, the adhesive layer 47 is formed on the internal surface of the package 33, and also the penetration hole 49 is formed in the substrate module 38.

The configuration of the other parts of the solid-state imaging apparatus 86 is substantially the same as that of the solid-state imaging apparatus 31 illustrated in FIG. 3, so that the parts corresponding to those in FIG. 3 are denoted by the same reference symbols, and overlapped description is omitted.

According to the solid-state imaging apparatus 86 according to this embodiment, as in the previous embodiments, because the adhesive layer 47 is formed on the internal surface of the cover body 41, when a minute foreign substance in the package 33 is moved due to vibration, shock, etc. also, the foreign substance is caused to adhere to the adhesive layer 47, so that adhesion of the foreign substance to the imaging surface of the solid-state imaging device chip 34 is essentially prevented. Further, because the penetration hole 49 is provided in the substrate module 38, even when gas and ion have been generated from the adhesive layer 47 due to an environmental change, the generated gas and ion are discharged to outside through the penetration hole 49, and erosion of the circuit wiring 36 and the electrode pad in the package 33 can be prevented.

Further, in this embodiment, an electric charge is introduced by applying a predetermined voltage, in this example a positive voltage, to the electrode plate 87 to accumulate the static charge in the highly insulating package 33, that is, in the cover body 41. Thereby, the dust in the package 33 is attracted to the charged cover body 41 to be forcibly adhered to the adhesive layer 47, and failure due to dust can be further decreased.

Accordingly, according to this embodiment, the reliability and the durability of a package-type solid-state imaging apparatus can be substantially improved.

A package-type solid-state imaging apparatus according to an embodiment of the invention can be configured by appropriately combining respective parts of the solid-state imaging apparatuses of the above-described embodiments of the invention.

Figure 1:
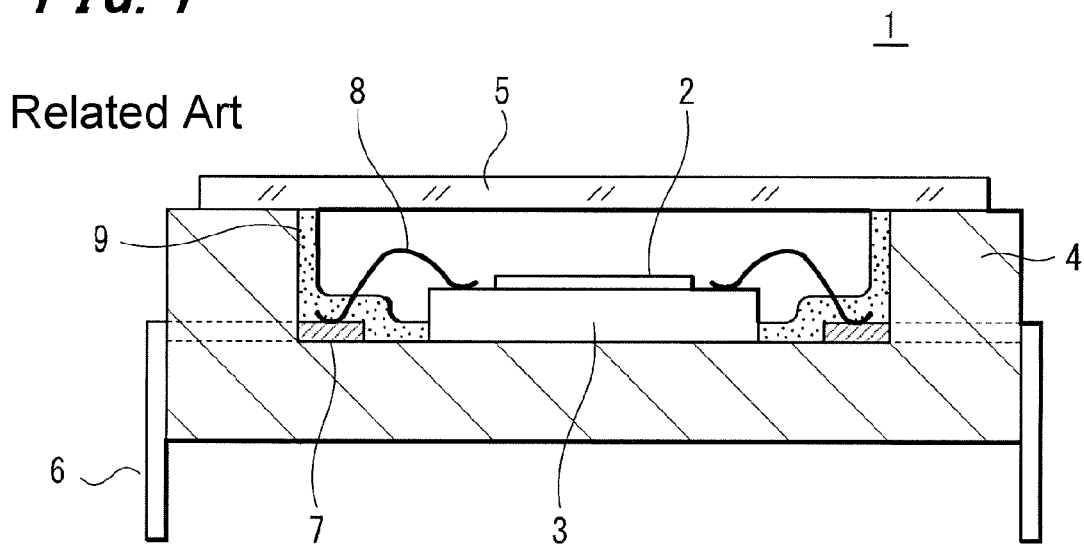
FIG. 1 is a schematic configuration diagram of an example of a package-type solid-state imaging apparatus of related art.
Figure 2:
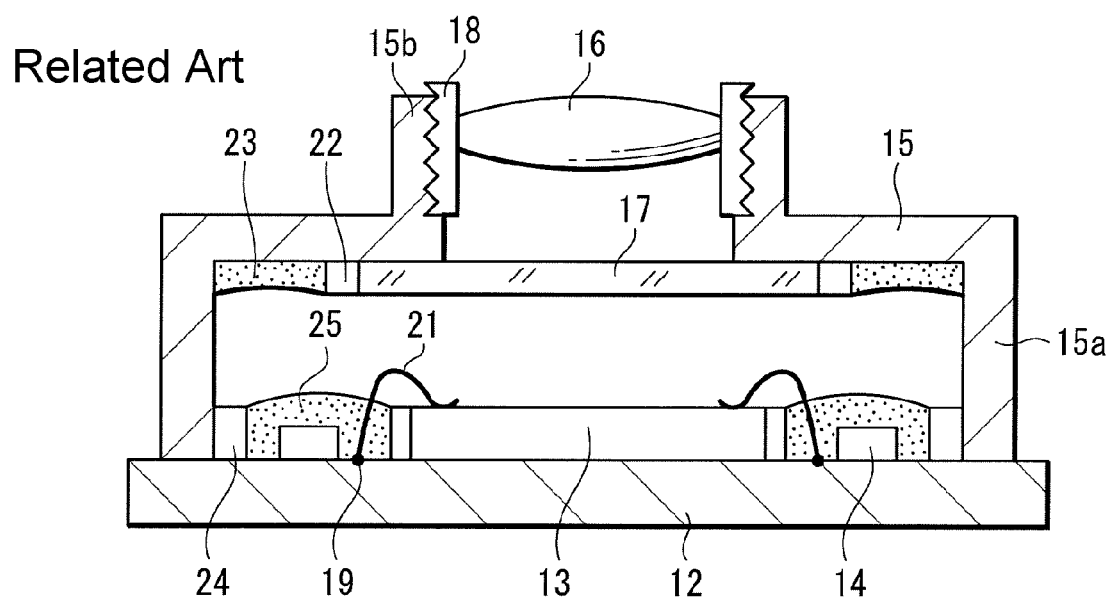
FIG. 2 is a schematic configuration diagram of another example of a package-type solid-state imaging apparatus of related art.

In the above-described examples, the invention has been applied to the solid-state imaging apparatus in which a solid-state imaging device chip has been enclosed in the package 33 including a substrate module, a cover body, and an optically transparent member; however, the invention can be applied to other types of package-type solid-state imaging apparatuses. For example, the invention can be applied to the solid-state imaging apparatus 1 as illustrated in FIG. 1, in which the solid-state imaging device chip 3 is enclosed in the package 4 made of ceramic, plastic or glass. That is, an adhesive layer may be formed on the internal surface of the package 4 and a penetration hole may be formed in the bottom part of the package 4 to communicate with an open space in the package 4 and/or a vent may be formed in a part of the connection part of the package 4 and an optically transparent member. In this case also, the effects similar to those described above can be achieved.

It should be understood by those skilled in the art that various modifications, combinations, sub-combinations, and alterations may occur depending on design requirements and other factors insofar as they are within the scope of the appended claims or the equivalents thereof.

What is claimed is:

1. A solid-state imaging apparatus comprising:
   a package including (i) an optically transparent member closing an opening in a top portion of the package and (ii) a cover body;
   a solid-state imaging device chip enclosed in the package;
   an adhesive layer on an internal surface of the package;
   a penetration hole in a bottom part of the package; and
   an electrode member in the cover body of the package, the electrode member being operative to induce a static charge in the package when a predetermined voltage is applied to the electrode member.

2. The solid-state imaging apparatus according to claim 1, wherein the penetration hole is formed in a part immediately below the solid-state imaging device chip of the bottom part of the package.

3. The solid-state imaging apparatus according to claim 2, wherein the gap is capable of preventing entry of dust from outside of the package.

4. The solid-state imaging apparatus according to claim 1, wherein:
   the package further includes a substrate module serving as the bottom part thereof,
   the cover body is connected with the optically transparent member and the substrate module, and
   the solid-state imaging device chip is mounted on the substrate module.

5. The solid-state imaging apparatus according to claim 4, wherein the adhesive layer is on a surface of the substrate module of the package, on an internal wall surface of the cover body, and on a surface other than an imaging surface of the solid-state imaging device chip.

6. The solid-state imaging apparatus according to claim 1, wherein the adhesive layer is on an internal wall surface of the cover body.

7. The solid-state imaging apparatus according to claim 1, wherein the electrode member is embedded in the cover body.

8. The solid-state imaging apparatus according to claim 1, wherein the electrode member does not extend into an open space in the package.

9. The solid-state imaging apparatus according to claim 1, wherein the static charge is induced in the cover body.

10. The solid-state imaging apparatus according to claim 1, wherein the electrode member is formed of a metal plate.

11. The solid-state imaging apparatus according to claim 1, wherein the electrode member is configured such that a part thereof extends outside of the package and serves as a terminal to which the predetermined voltage is applied.

12. The solid-state imaging apparatus according to claim 1, wherein the predetermined voltage is a predetermined positive voltage.

13. The solid-state imaging apparatus according to claim 1, wherein the predetermined voltage is a predetermined negative voltage.

* * * * *